(12) United States Patent
Lyu

(10) Patent No.: US 8,324,550 B2
(45) Date of Patent: Dec. 4, 2012

(54) HIGH DYNAMIC RANGE IMAGING SYSTEMS

(75) Inventor: Jeong Ho Lyu, San Jose, CA (US)

(73) Assignee: Aptina Imaging Corporation, George Town (KY)

( * ) Notice: Subject to any disclaimer, the term of this patent is extended or adjusted under 35 U.S.C. 154(b) by 357 days.

(21) Appl. No.: 12/821,120

(22) Filed: Jun. 22, 2010

(65) Prior Publication Data

US 2011/0309232 A1 Dec. 22, 2011

(51) Int. Cl.
*H01L 27/00* (2006.01)
*H01J 40/14* (2006.01)

(52) U.S. Cl. .............. 250/208.1; 250/214 R; 348/295; 348/308

(58) Field of Classification Search ............... 250/208.1, 250/214 R, 214 P, 214 L; 348/295, 297, 348/308, 332
See application file for complete search history.

(56) References Cited

U.S. PATENT DOCUMENTS

| | | | |
|---|---|---|---|
| 7,382,407 B2 | 6/2008 | Cho et al. | |
| 7,397,509 B2 | 7/2008 | Krymski | |
| 2007/0285526 A1 | 12/2007 | Mann et al. | |
| 2008/0219585 A1 | 9/2008 | Kasai et al. | |
| 2008/0267522 A1 | 10/2008 | Kobayashi | |
| 2009/0021612 A1 | 1/2009 | Hamilton et al. | |
| 2009/0040349 A1 | 2/2009 | Xu | |
| 2009/0040364 A1 | 2/2009 | Rubner | |
| 2012/0175499 A1* | 7/2012 | Meynants et al. ..........  | 250/208.1 |

OTHER PUBLICATIONS

Sugawa et al., "A 100dB Dynamic Range CMOS Image Sensor Using a Lateral Overflow Integration Capacitor", IEEE International Solid-State Circuits Conference, pp. 352, 353, and 603, 2005.
Smith et al., U.S. Appl. No. 12/480,651, filed Jun. 8, 2009.

* cited by examiner

*Primary Examiner* — Kevin Pyo
(74) *Attorney, Agent, or Firm* — Treyz Law Group; David C. Kellogg; G. Victor Treyz

(57) ABSTRACT

An imaging system may include an imager with pixels and with reset lines that can be selectively deactivated and floated. When the reset lines are deactivated and floated, the reset lines may be connected to floating diffusion nodes in the pixels to increase the capacitance of the floating diffusion nodes. The reset lines may have parasitic capacitances that are used to supplement the capacitances of the floating diffusion nodes, when the reset lines are connected to the floating diffusion nodes. The imager may be used to capture high dynamic range images by simultaneously capturing a first image with a long integration time and a second image with a short integration time. The first and second images may be combined into a high dynamic range image.

20 Claims, 6 Drawing Sheets

HIGH DYNAMIC RANGE IMAGING SYSTEMS

BACKGROUND

This relates to imaging systems and, more particularly, to high dynamic range imaging systems that may include high dynamic range image sensors.

Modern electronic devices such as cellular telephones, cameras, and computers often use digital image sensors such as high dynamic range image sensors. Imagers (i.e., image sensors) may be formed from a two-dimensional array of image sensing pixels. Each pixel receives incident photons (light) and converts the photons into electrical signals.

High dynamic range imagers are designed to capture scenes with light ranges that exceed the typical dynamic range of an individual linear pixel or an analog-to-digital converter. The dynamic range of a pixel can be defined as the ratio of a minimum luminance or brightness in an image that causes the pixel to saturate to the brightness in an image at which the pixel achieves a signal-to-noise ratio (SNR) equal to one. The dynamic range of a scene can be expressed as the ratio of its highest illumination level to its lowest illumination level.

Examples of commonly used techniques for capturing high dynamic range images include combining multiple exposures of varying exposure times, utilizing partial reset level techniques, and providing pixels with logarithmic or other non-linear responses. With a multiple exposure technique, an image sensor takes a first long exposure and then takes a second short exposure. The two exposures are then combined into a high dynamic range image. However, because the two exposures are taken at different times, the image sensor is incapable of capturing scenes that include fast moving objects. In addition, the conventional digital image sensors require excessive amounts of storage (e.g., buffer memory or additional in-pixel storage nodes), thereby increasing the cost of devices that include such sensors.

In one conventional arrangement, each of the pixels in a high dynamic range imager includes a capacitor connected through a switch to a floating diffusion node in that pixel. The capacitors in each of the pixels are used in increasing the dynamic range of the imager. However, this type of conventional arrangement requires an additional switch and capacitor in each of the pixels of an imager.

It would therefore be desirable to provide improved high dynamic range imaging systems.

DETAILED DESCRIPTION

Figure 1:
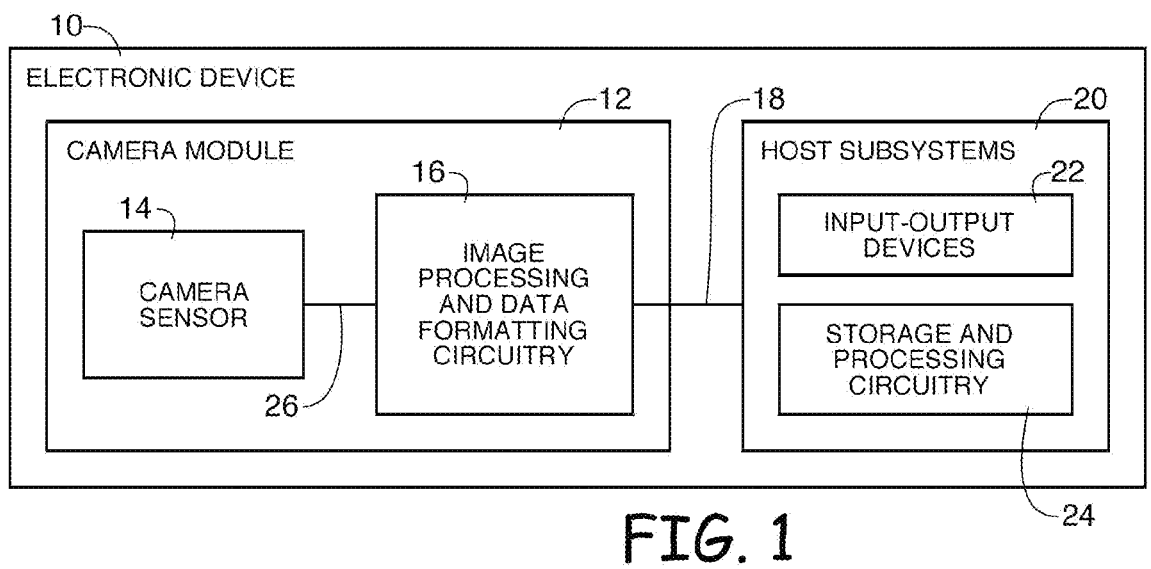
FIG. 1 is a diagram of an illustrative electronic device that may include a camera module with a high dynamic range image sensor in accordance with an embodiment of the present invention.

An electronic device with a digital camera module is shown in FIG. 1. Electronic device 10 may be a digital camera, a computer, a cellular telephone, a medical device, or other electronic device. Camera module 12 may include image sensor 14 and one or more lenses. During operation, the lenses focus light onto image sensor 14. Image sensor 14 includes photosensitive elements (i.e., pixels) that convert the light into digital data. Image sensors may have any number of pixels (e.g., hundreds, thousands, millions, or more). A typical image sensor may, for example, have millions of pixels (e.g., megapixels).

Still and video image data from camera sensor 14 may be provided to image processing and data formatting circuitry 16 via path 26. Image processing and data formatting circuitry 16 may be used to perform image processing functions such as data formatting, adjusting white balance and exposure, implementing video image stabilization, face detection, etc. Image processing and data formatting circuitry 16 may also be used to compress raw camera image files if desired (e.g., to Joint Photographic Experts Group or JPEG format). In a typical arrangement, which is sometimes referred to as a system on chip or SOC arrangement, camera sensor 14 and image processing and data formatting circuitry 16 are implemented on a common integrated circuit. The use of a single integrated circuit to implement camera sensor 14 and image processing and data formatting circuitry 16 can help to minimize costs.

Camera module 12 (e.g., image processing and data formatting circuitry 16) conveys acquired image data to host subsystem 20 over path 18. Electronic device 10 typically provides a user with numerous high-level functions. In a computer or advanced cellular telephone, for example, a user may be provided with the ability to run user applications. To implement these functions, host subsystem 20 of electronic device 10 may have input-output devices 22 such as keypads, input-output ports, joysticks, and displays and storage and processing circuitry 24. Storage and processing circuitry 24 may include volatile and nonvolatile memory (e.g., random-access memory, flash memory, hard drives, solid state drives, etc.). Storage and processing circuitry 24 may also include microprocessors, microcontrollers, digital signal processors, application specific integrated circuits, etc.

Figure 2:
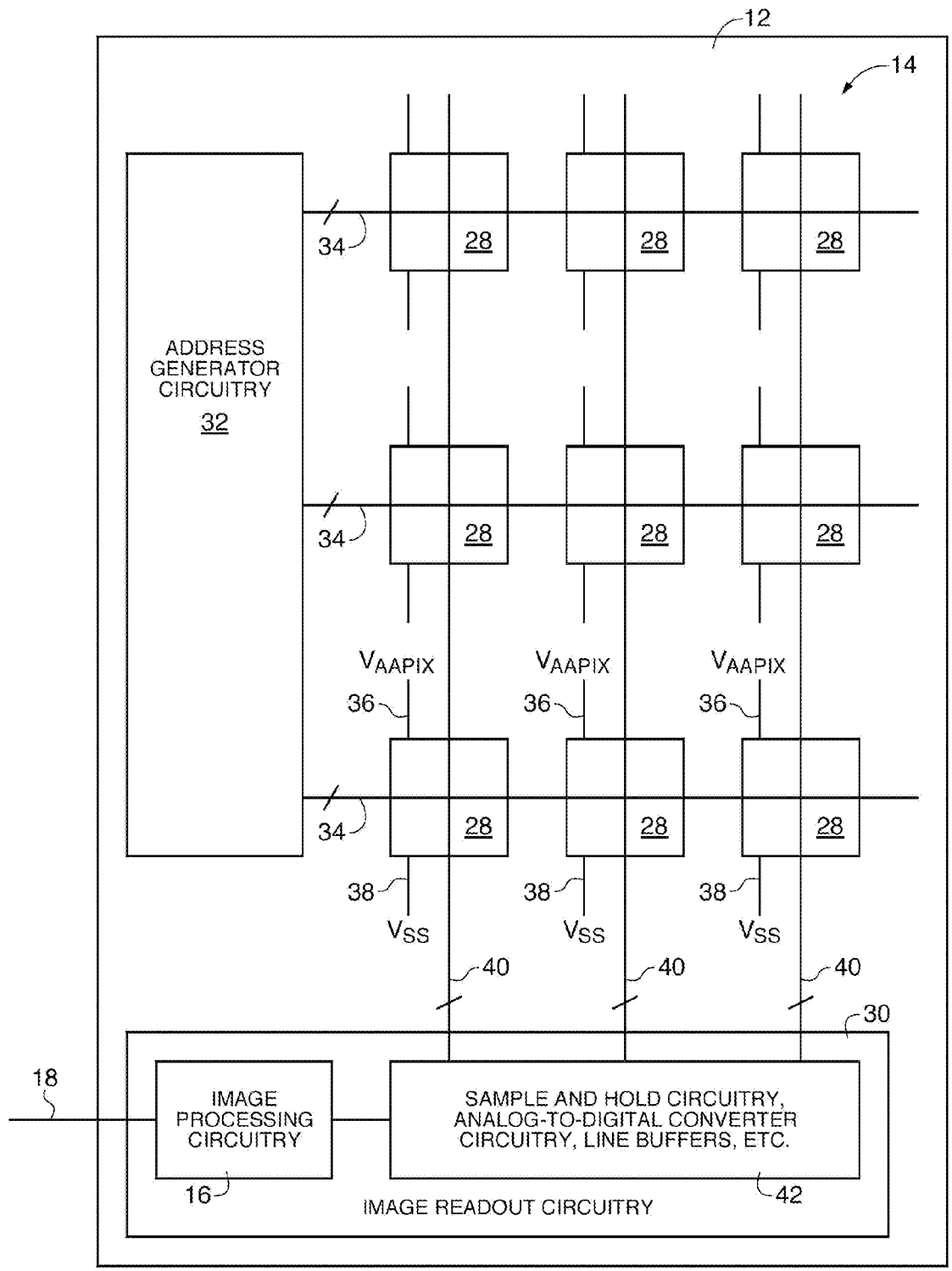
FIG. 2 is a diagram of an illustrative array of light-sensitive pixels and control circuitry coupled to the array of pixels in a high dynamic range image sensor in accordance with an embodiment of the present invention.

An example of an arrangement for sensor array 14 is shown in FIG. 2. As shown in FIG. 2, device 10 may include an array 14 of pixels 28 coupled to image readout circuitry 30 and address generator circuitry 32. As an example, each of the pixels in a row of array 14 may be coupled to address generator circuitry 32 by one or more conductive lines 34. Array 14 may have any number of rows and columns. In general, the size of array 14 and the number of rows and columns in array 14 will depend on the particular implementation. While rows and columns are generally described herein as being horizontal and vertical rows and columns may refer to any grid-like structure (e.g., features described herein as rows may be arranged vertically and features described herein as columns may be arranged horizontally).

As one example, lines 34 may include reset lines that can be used to couple the pixels in a particular row of array 14 to a power supply terminal such as positive power supply terminals 36 or ground power supply terminals 38 to reset the pixels. In one example, accumulated charges on pixels 28 may be erased by connecting pixels 28 to a power supply terminal such as terminal 36 and/or 38 and allowing accumulated charges to dissipate into power supply lines in circuitry 12. If desired, sensor 14 can include a global reset line that resets all of pixels 28 in array 14 simultaneously. With this type of arrangement, reset lines in lines 34 may be connected together to form a single global reset line. Reset lines in lines 34 may carry signals that control reset transistors in pixels 28 and that are sometimes referred to as pixel reset pointers.

Lines 34 may include control lines that are used to control transfer transistors in pixels 28. Transfer transistors may be used to transfer accumulated charges in pixels 28 from light sensitive devices (e.g., photodiodes or other light sensitive devices) to storage elements (e.g., floating diffusion nodes or other storage elements) in pixels 28. If desired, sensor 14 may include one or more global transfer lines. With this type of arrangement, a global transfer line may be used to implement a global shutter scheme in which the accumulated charges from a plurality of pixels 28 in different rows of array 14 are simultaneously transferred to the respective storage elements in those pixels. The accumulated charges may then be read out from the storage elements at a later time. Transfer lines in lines 34 may convey signals sometimes referred to as transfer pointers or global transfer pointers (as examples).

With one arrangement, transfer lines in lines 34 may be used in conjunction with reset lines in lines 34 during a reset operation of pixels 28. As one example, transfer signals on transfer lines and reset signals on reset lines may be asserted simultaneously during a reset operation (e.g., so that the reset operation discharges accumulated charges from the storage elements and the light sensitive devices in pixels 28).

Lines 34 may include control lines coupled to readout transistors in pixels 28 of array 14. With this type of arrangement, row select signals, sometimes referred to herein as readout signals and pixel read pointers, may be asserted on control lines in lines 34 to connect a row of pixels 28 to image readout circuitry 30. For example, when row select signals are asserted on a given row select line, pixels 28 associated with that given row select line are coupled to image readout circuitry 30 through column readout lines 40. When a row of pixels 28 is coupled to image readout circuitry 30, signals representative of the accumulated charge on pixels 28 and signals representative of reset voltages on pixels 28 may be conveyed over column readout lines 40 to circuitry 30.

Address generator circuitry 32 may generate signals on control in lines paths 34 as desired. For example, address generator circuitry 32 may generate reset signals on reset lines in paths 34, transfer signals on transfer lines in paths 34, and row select (e.g., row readout) signals on row select lines in paths 34 to control the operation of array 14. If desired, address generator circuitry 32 and array 14 may be integrated together in a single integrated circuit (as an example).

Image readout circuitry 30 may include circuitry 42 and image processing and data formatting circuitry 16. Circuitry 42 may include sample and hold circuitry, analog-to-digital converter circuitry, and line buffer circuitry (as examples). As one example, circuitry 42 may be used to measure signals in pixels 28 and may be used to buffer the signals while analog-to-digital converters in circuitry 42 convert the signals to digital signals. In a typical arrangement, circuitry 42 reads signals from rows of pixels 28 one row at a time over lines 40. The digital signals read out by circuitry 42 may be representative of charges accumulated by pixels 28 in response to incident light. The digital signals produced by the analog-to-digital converters of circuitry 42 may be conveyed to image processing and data formatting circuitry 16 and then to host subsystem 20 (FIG. 1) over path 18.

Figure 3:
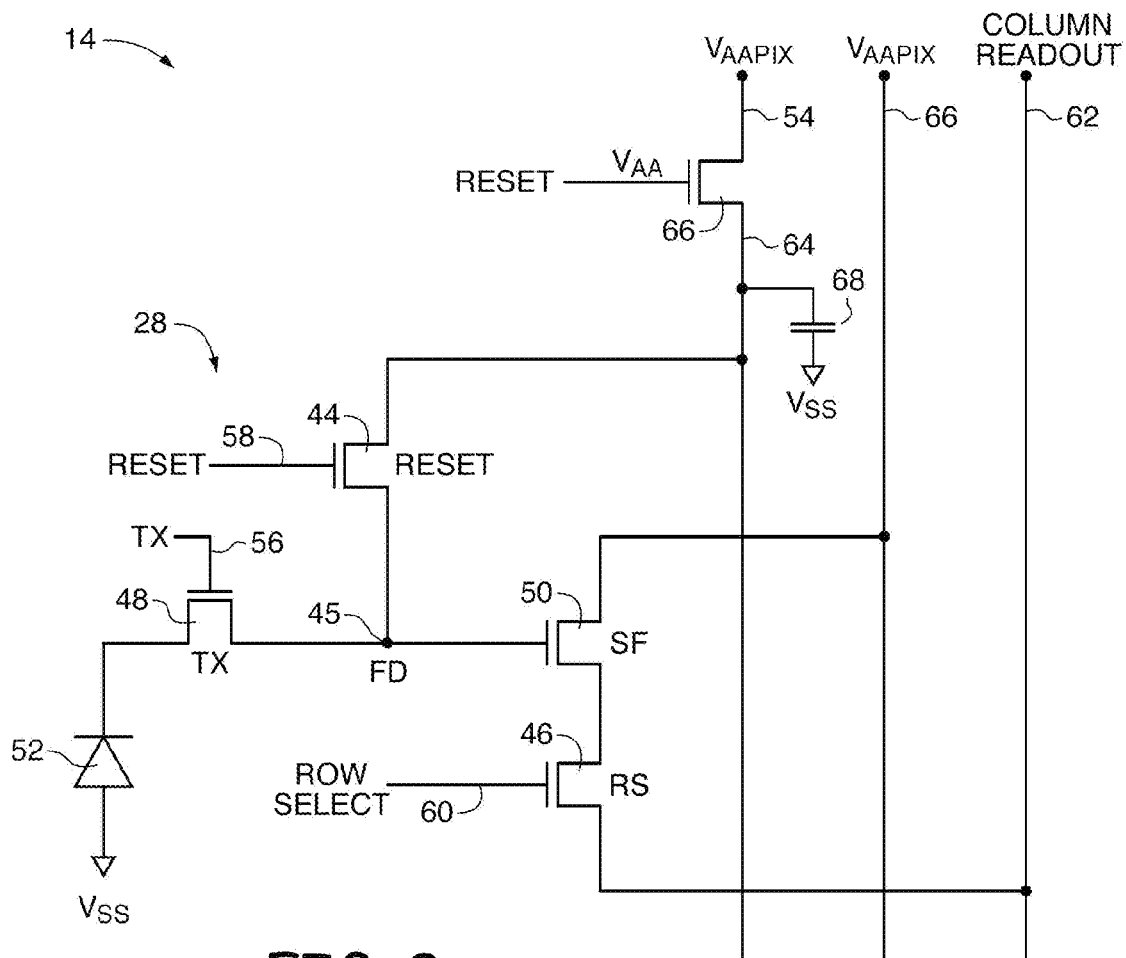
FIG. 3 is a diagram of an illustrative light-sensitive pixel in a high dynamic range image sensor in which a reset line with a parasitic capacitance can be used to increase the capacitance of a floating diffusion node in the pixel in accordance with an embodiment of the present invention.

An example of an image sensing pixel that may be used in array 14 of FIG. 2 is shown in FIG. 3. As shown in FIG. 3, each pixel 28 of array 14 may include transistors such as reset transistor 44, row select transistor 46, transfer transistor 48, and source-follower transistor 50. Pixel 28 may include a photosensitive device such as photodiode 52 (sometimes referred to herein as a photosensitive element). In general, it is desirable to maximize the light collecting area of photosensitive device 52 relative to the total area of each pixel 28. This type of arrangement helps to maximize the sensitivity of each pixel 28 (and sensor 14) to incident light.

The photosensitive device in each pixel 28 of array 14 can accumulate charge in response to incident light (e.g., light which strikes photosensitive device 52). The time between a reset operation in which the accumulated charge is reset and a readout operation or a transfer operation (in which the accumulated charge is shifted to a storage element such as floating diffusion node FD) is sometimes referred to herein as an integration time or an exposure time. The accumulated charge generated by photosensitive device 52 may be proportional to the intensity of the incident light and the integration time. Relatively long integration times may be used to capture scenes with relatively low intensities (e.g., to ensure that the accumulated charge is sufficient to overcome noise in array 14) and relatively short integration times may be used to capture scenes with relatively high intensities (e.g., to ensure that the accumulated charge does not reach a saturation point).

As shown in FIG. 3, array 14 may include transistors 66 between each reset line 64 and a reset power supply node such as node 54. Transistors 66 may be used to selectively connect reset lines 64 to reset power supply node 54 or to isolate reset lines 64 from node 54. When a transistor 66 that is associated with a reset line 64 is turned off, the voltage of that reset line may float (e.g., the reset line has a floating voltage). Capacitor 68 may represent the parasitic capacitance produced by reset line 64 and need not be implemented as a discrete capacitor element. If desired, however, each reset line 64 (e.g., each column of pixels 28 in array 14) may include a discrete capacitor to use as capacitor 68.

The capacitance of each reset line 64 (shown as capacitor 68) may be used to supplement the capacitances of floating diffusion node 45 in pixel 28 (e.g., to adjust the capacitances of the floating diffusion nodes of pixels 28 in array 14). If desired, floating diffusion node 45 may be omitted and the capacitance of reset line 64 may be selectively connected to photodiode 52 in pixel 28. The capacitance of pixel 28 may be increased (and decreased) to modulate the conversion gain (e.g., the internal amplification) of pixels 28 in array 14. This type of arrangement may be used in capturing high dynamic range images (as an example). When transistor 66 is turned on by reset control signals RESET $V_{AA}$, reset line 64 may be powered (e.g., line 64 may be coupled to node 54) to allow pixel 28 to be reset. When transistor 66 is turned off by reset control signals RESET $V_{AA}$ and the reset transistor 44 in a particular pixel 28 is turned on, the voltage on reset line 64 may float and the parasitic capacitance of reset line 64 (illustrated as capacitor 68) may be combined with the capacitance of the floating diffusion node 45 in that pixel 28. In this type of situation, the conversion gain of pixel 28 may be reduced relative to arrangements in which the parasitic capacitance of reset line 64 is not utilized in this way.

Reset line 64 may have a parasitic capacitance (shown as capacitor 68) of less than 0.5 femtofarad (fF), less than 1.0 fF, less than 2.0 fF, less than 5.0 fF, less than 10.0 fF, less than 15.0 fF, less than 25 fF, less than 50 fF, or greater than 50 fF. Floating diffusion node 45 (which is sometimes illustrated as a capacitor) may have a capacitance of less than 0.2 fF, less than 0.5 fF, less than 1.0 fF, less than 2.0 fF, less than 5.0 fF, less than 10.0 fF, or greater than 10.0 fF.

Reset transistor 44 can be used to reset pixel 28. During reset operations, reset control transistor 66 may be turned on by signals RESET $V_{AA}$ to activate reset line 64 and reset transistor 44 may be turned on by reset signals on reset line 58. When reset signals (RESET) on reset line 58 and reset control signals RESET $V_{AA}$ are asserted, transistors 44 and 66 may be turned on and may allow accumulated charge on diffusion node 45 to flow into a power supply line (e.g., through power supply terminal 54). In one embodiment, transfer signals (TX) on transfer line 56 may also be asserted during reset operations, such that the charges on both photosensitive element 52 and diffusion node 45 are reset.

Transfer transistor 48 may be controlled by transfer line 56. When transfer signals (TX) on transfer line 56 are asserted, transistor 48 may be turned on and may allow accumulated charge from photodiode 52 to flow to other transistors in pixel 28 or to a storage element such as floating diffusion node 45. Reset transistor 44 may be turned on and reset control transistor 66 may be turned off when transfer transistor 48 is turned on so that the accumulated charge from photodiode 52 flows to floating diffusion node 45 and to capacitor 68 (e.g., so that the parasitic capacitance of reset line 64 increases the capacitance of node 45). Transfer transistor 48 may be turned on prior to a readout operation to allow the accumulated charge from photodiode 52 to flow to floating diffusion node 45 and, if desired, capacitor 68. Transfer transistor 48 may be turned on during a readout operation to allow the accumulated charge from photodiode 52 to flow to the gate of source-follower transistor 50.

Source-follower transistor 50 and row select transistor 46 may be used during a readout operation of pixel 28. Row select transistor 46 may be controlled by row select (ROW SELECT) signals on line 60. Source-follower transistor 50 may be coupled between a power supply line such as line 66 and row select transistor 46. Source-follower transistor 50 may be controlled by the accumulated charge generated by the photodiode 52 (which may be stored in diffusion node 45 and capacitor 68). When row select signals on line 60 are asserted, transistor 46 may be turned on, while the accumulated charge from the photodiode 52 is used to control transistor 50. The voltage that the accumulated charge applies to the gate of transistor 50 determines the voltage of column readout (COLUMN READOUT) line 62. Image readout circuitry 30 of FIG. 2 may then determine the voltage of the accumulated charge in pixel 28 by sampling the voltage of line 62. If desired, image readout circuitry 30 may utilize a correlated double sampling technique in which the reset level of pixel 28 is also measured and the reset level is subtracted from the image signal level (e.g., the voltage of the accumulated charge in pixel 28).

Figure 4:
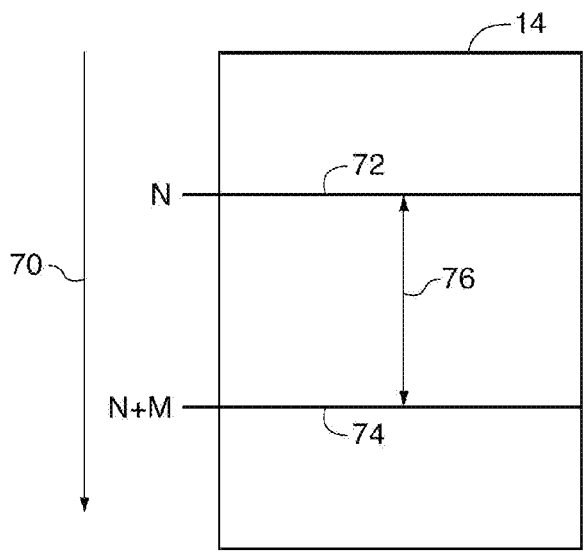
FIG. 4 is a diagram of illustrative column address signals that may be used in controlling an image sensor with an electronic rolling shutter in accordance with an embodiment of the present invention.

Data may be read out of image sensor array 14 using various techniques such as an electronic global shutter and/or an electronic rolling shutter. FIG. 4 is a diagram illustrating an implementation for array 14 in which array 14 is read out using an electronic rolling shutter.

As shown in FIG. 4, an electronic rolling shutter may include reset pointer 74 and read pointer 72. Pointers 72 and 74 may address row N and row N+M, respectively, and may scroll through array 14 in direction 70. The value of M (e.g., the separation in time and distance between pointers 72 and 74 represented as distance 76) may be constant as each image is captured by array 14 and may be proportional to the integration time of array 14 (e.g., the length of time that pixels 28 are exposed to light after being reset and before being read out). In general the value of M may be varied (e.g., to increase or decrease the length of time each pixel 28 is exposed). When array 14 is used in capturing multiple images (such as when capturing video), pointers 72 and 74 may loop through array 14 (e.g., pointers 72 and 74 may restart at the top of array 14 after reaching the bottom of array 14).

Read pointer 72 may address row N in array 14 (e.g., read pointer 72 may address one or more rows of pixels in array 14). Read pointer 72 may include row select signals ROW SELECT on the row select line associated with row N that control the row select transistors in row N, reset signals RESET on the reset line associated with row N that control the reset transistors in row N, reset control signals RESET $V_{AA}$ that turn on and turn off reset control transistors 66, and transfer signals TX on the transfer line that turns on the transfer transistors in row N (as examples). When row select transistors 46 in a particular row of array 14 are activated, image readout circuitry 30 (FIG. 2) may read out image data from the pixels in that row of array 14. After the N row of array 14 is read out, read pointer 72 may move on to the next row (e.g., the value of N may be increased by one).

Reset pointer 74 may address row N+M in array 14. Reset pointer 74 may include signals that reset those pixels. Reset pointer 74 may include reset signals RESET on the reset line associated with row N+M that control the reset transistors in row N+M, reset control signals RESET $V_{AA}$ that control reset control transistors 66 (e.g., that activate reset lines 64), and transfer signals TX on the transfer line that control the transfer transistors in row N+M (as examples). After the N+M row of array 14 is reset out, reset pointer 74 may move on to the next row (e.g., the value of N may be increased by one).

Figure 5:
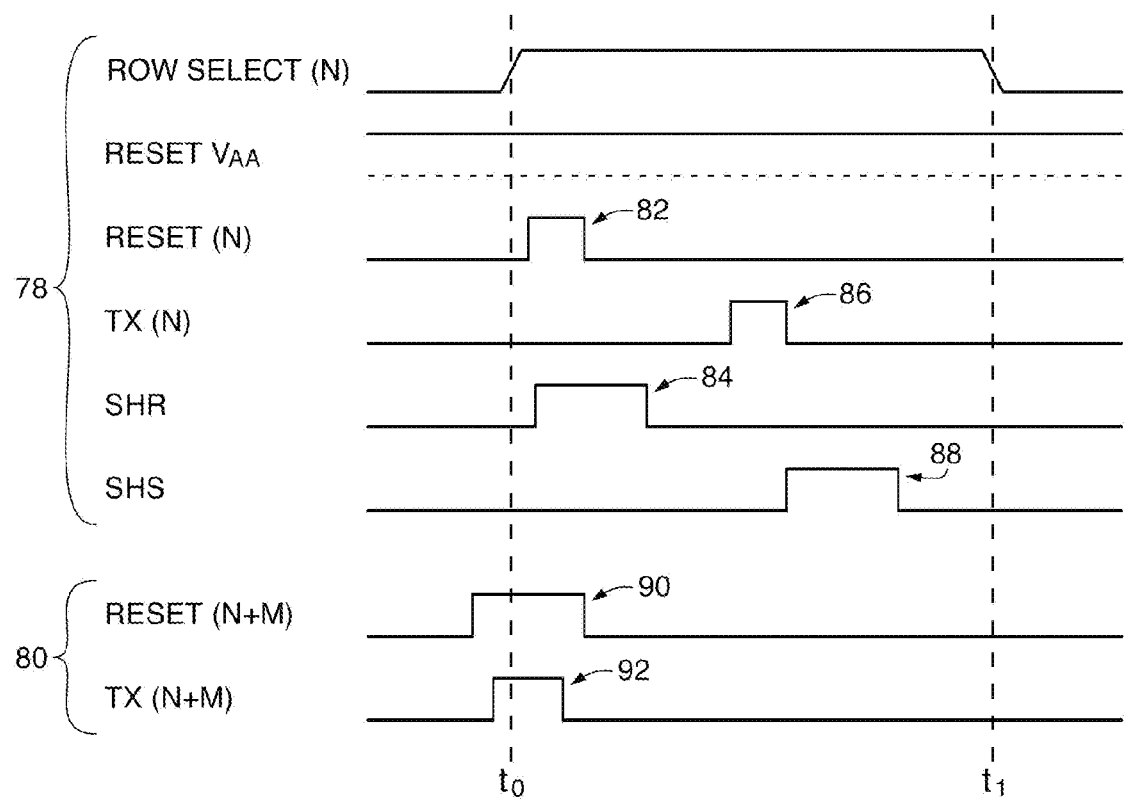
FIG. 5 is a graph of illustrative control signals that may be used in controlling an image sensor with light-sensitive pixels of the type shown in FIG. 3 in a high conversion gain mode in accordance with an embodiment of the present invention.

A graph of illustrative control signals that may be used in controlling an image sensor such as image sensor array 14 of FIG. 2 that includes light-sensitive pixels 28 (FIG. 3) is shown in FIG. 5. In the example of FIG. 5, reset lines 64 are not used in increasing the capacitance of floating diffusion nodes 45 (e.g., reset control signals $V_{AA}$ may remain high to activate reset control transistors 66 between times $t_0$ and $t_1$). The arrangement shown in FIG. 5 may sometimes be referred to as a high conversion gain mode or a low floating diffusion capacitance mode.

As shown in the example of FIG. 5, read pointer signals 78 may read out row N of array 14 and reset pointer signals 80 may reset row N+M of array 14 (e.g., signals 78 and 80 may scroll through array 14 in an electronic rolling shutter technique). Between times $t_0$ and $t_1$, row select signals ROW SELECT(N) may be asserted so that row N of array 14 may be read out. After time $t_1$, read pointer signals 78 and reset pointer signals 80 may be applied to the next row of array 14 (e.g., the value of N may be increased by one or, if the end of array 14 has been reached, the value of N may be reset to a starting value such as one).

With one suitable arrangement, pixels 28 may be read out using a correlated double sample scheme. In this type of arrangement, reset pulse 82 activates the reset transistors in row N, which resets the voltages on floating diffusion nodes 45. Because the reset voltages of nodes 45 can vary slightly, it may be desirable to sample the reset voltages of nodes 45

(e.g., so that the reset voltages can be subtracted from image signals at a later time). Sample and hold signals (SHR) 84 may be asserted in circuitry 42 to sample and hold the reset voltages of nodes 45. Transfer signal TX(N) 86 activates the transfer transistors in row N, which transfers image charges accumulated by photodiodes 52 in response to incident light from photodiodes 52 to floating diffusion nodes 45 in each pixel 28 in row N. Sample and hold signals (SHS) 88 may be asserted in circuitry 42 to sample and hold the accumulated charges in nodes 45 (e.g., the accumulated charges transferred from photodiodes 52). Circuitry 52 may then subtract the reset voltages from the accumulated charges (e.g., to reduce the noise levels in the accumulated charges). If desired, sample and hold circuitry 42 may sample reset voltages and accumulated charges on the falling edges of signals 84 and 88.

Between times $t_0$ and $t_1$, row N+M of array 14 may be reset. Reset signals 90 and transfer signals 92 may be asserted to reset floating diffusion nodes 45 and photodiodes 52 in row N+M.

Figure 6:
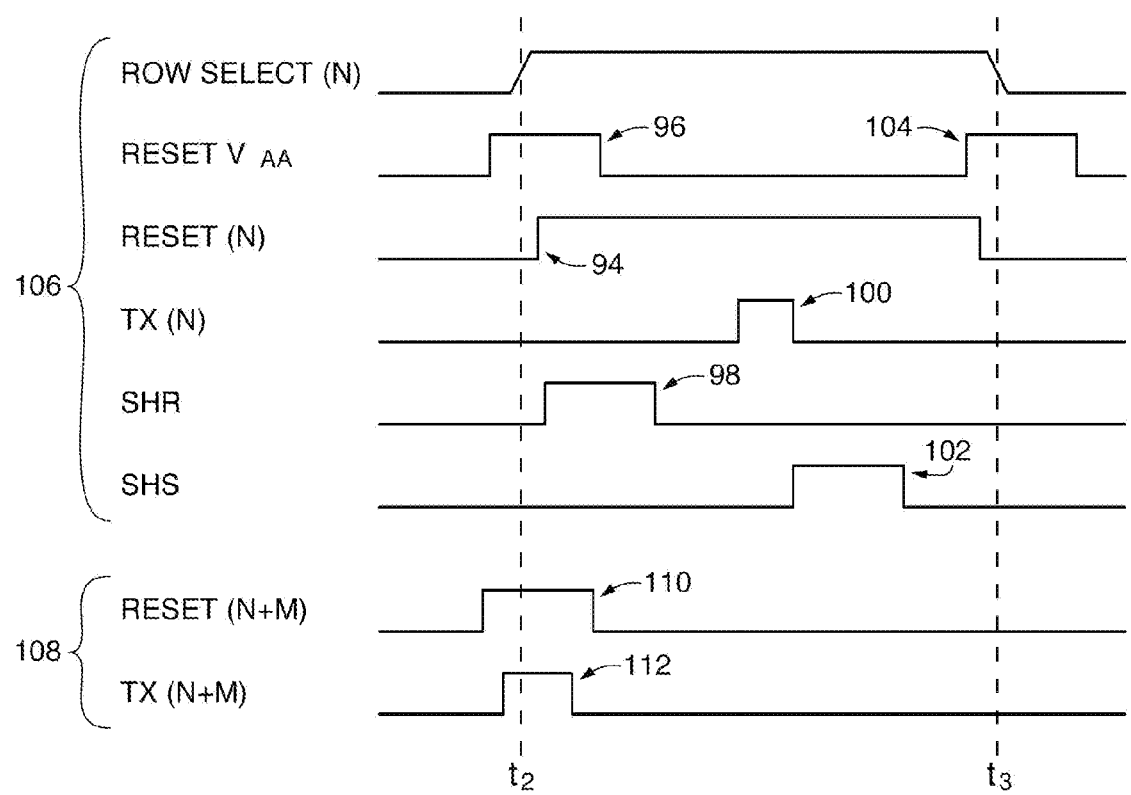
FIG. 6 is a graph of illustrative control signals that may be used in controlling an image sensor with light-sensitive pixels of the type shown in FIG. 3 in a low conversion gain mode in accordance with an embodiment of the present invention.

When reset lines 64 are used in increasing the capacitance of pixels 28, control signals such as the control signals in the graph of FIG. 6 may be used. The arrangement shown in FIG. 6 may sometimes be referred to as a low conversion gain mode or a high floating diffusion capacitance mode.

As shown in the example of FIG. 6, read pointer signals 106 may read out row N of array 14 and reset pointer signals 108 may reset row N+M of array 14 (e.g., signals 106 and 108 may scroll through array 14 in an electronic rolling shutter technique). Between times $t_2$ and $t_3$, row select signals ROW SELECT(N) may be asserted so that row N of array 14 may be read out. After time $t_3$, read pointer signals 106 and reset pointer signals 108 may be applied to the next row of array 14 (e.g., the value of N may be increased by one or, if the end of array 14 has been reached, the value of N may be reset to a starting value such as one).

With one suitable arrangement, pixels 28 may be read out using a correlated double sample scheme. In this type of arrangement, reset signals (RESET(N)) may be taken high at time 94, thereby activating the reset transistors in row N and resetting the voltages on floating diffusion nodes 45 in row N. At time 96, reset control signals $V_{AA}$ may be deasserted (e.g., to turn off reset control transistors 66). When reset control transistors 66 are turned off in this way and reset signals (RESET(N)) remain asserted, the capacitance of each of the floating diffusion nodes 45 in row N is supplemented by the capacitance of one of the reset lines 64 in sensor array 14.

Sample and hold signals (SHR) 98 may be asserted in circuitry 42 to sample and hold the reset voltages of nodes 45. Transfer signal TX(N) 100 activates the transfer transistors in row N, which transfers image charges accumulated by photodiodes 52 in response to incident light from photodiodes 52 to floating diffusion nodes 45 and reset lines 64 (e.g., capacitors 68) for each pixel 28 in row N. Sample and hold signals (SHS) 102 may be asserted in circuitry 42 to sample and hold the accumulated charges in nodes 45 and reset lines 64 (e.g., the accumulated charges transferred from photodiodes 52). Circuitry 52 may then subtract the reset voltages from the accumulated charges (e.g., to reduce the noise levels in the accumulated charges). If desired, sample and hold circuitry 42 may sample reset voltages and accumulated charges on the falling edges of signals 98 and 102.

At time 104, reset control signals $V_{AA}$ may be asserted (e.g., to turn on reset control transistors 66).

Between times $t_2$ and $t_3$, row N+M of array 14 may be reset. Reset signals 110 and transfer signals 112 may be asserted to reset floating diffusion nodes 45 and photodiodes 52 in row N+M (e.g., while reset control signals $V_{AA}$ are asserted, before time 96 or after time 104).

Figure 7:
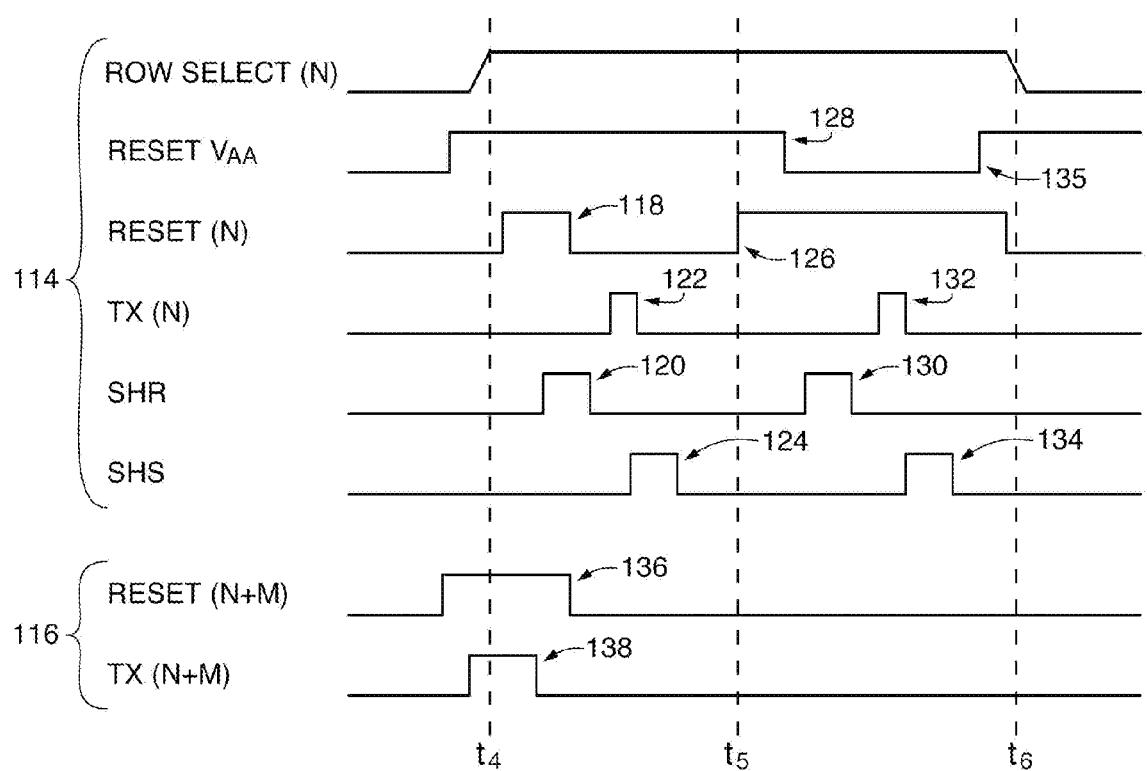
FIG. 7 is a graph of illustrative control signals that may be used in controlling an image sensor with light-sensitive pixels of the type shown in FIG. 3 in a high dynamic range mode in accordance with an embodiment of the present invention.

If desired, image sensor array 14 of FIG. 2 may be operated in a high dynamic range mode as shown in the example of FIG. 7. The high dynamic range mode shown in FIG. 7 may include a high conversion gain readout operation between times $t_4$ and $t_5$ (e.g., a readout operation in which the capacitance of floating diffusion nodes 45 is not supplemented by reset lines 64) and a low conversion gain readout operation between times $t_5$ and $t_6$ (e.g., a readout operation in which the capacitance of floating diffusion nodes 45 is supplemented by reset lines 64). In the high dynamic range mode, array 14 may capture a first image with a relatively long integration time $t_{long}$ and a second image with a relatively short integration time $t_{short}$ with each pass of an electronic rolling shutter through array 14. The long integration time $t_{long}$ may be determined by the distance between reset pointer signals 116 and read pointer signals 114 (e.g., the value of M). The short integration time $t_{short}$ may occur within times $t_4$ and $t_6$. The first image may, by virtue of its relatively long integration time, capture useful image data (e.g., image data with a signal-to-noise ratio above 1 and which is not above a saturation level) on portions of a scene that are not brightly lit and the second image may, by virtue of its relatively short integration time, capture useful image data on portions of a scene that are brightly lit (e.g., portions of a scene that may be washed out and above the saturation level in the first image). The arrangement shown in FIG. 7 allows the second image to be captured as the first image is being read out (e.g., the time during which the first and second images are captured substantially overlaps). The first and second images may be combined to form a high dynamic range image (e.g., an image with a light range that exceeds the dynamic range of a single pixel in array 14). As one example, image readout circuitry 30 (FIG. 2) may combine the first and second images into a high dynamic range image.

As shown in the example of FIG. 7, read pointer signals 114 may read out row N of array 14 and reset pointer signals 116 may reset row N+M of array 14 (e.g., signals 114 and 116 may scroll through array 14 in an electronic rolling shutter technique). Between times $t_4$ and $t_6$, row select signals ROW SELECT(N) may be asserted so that row N of array 14 may be read out a first time. Between times $t_5$ and $t_6$, row N of array 14 may be read out a second time. After time $t_6$, read pointer signals 114 and reset pointer signals 116 may be applied to the next row of array 14 (e.g., the value of N may be increased by one or, if the end of array 14 has been reached, the value of N may be reset to a starting value such as one).

Between times $t_4$ and $t_5$, a first image with a relatively long integration time $t_{long}$ may be read out from array 14. Reset signals (RESET(N)) may be taken high at time 118, thereby activating the reset transistors in row N and resetting the voltages on floating diffusion nodes 45 in row N. Sample and hold signals (SHR) 120 may be asserted in circuitry 42 to sample and hold the reset voltages of nodes 45 in row N for the first image. Transfer signal TX(N) 122 activates the transfer transistors in row N, which transfers image charges accumulated by photodiodes 52 in response to incident light during the long integration time of the first image from photodiodes 52 to floating diffusion nodes 45 in each pixel 28 in row N. Sample and hold signals (SHS) 124 may be asserted in circuitry 42 to sample and hold the accumulated charges for the first image from nodes 45 in row N (e.g., the accumulated charges transferred from photodiodes 52). Circuitry 52 may then subtract the reset voltages from the accumulated charges (e.g., to reduce noise levels in the accumulated charges). If desired, sample and hold circuitry 42 may sample reset voltages and accumulated charges on the falling edges of signals 120 and 124.

Because all of the accumulated charge on photodiode 52 is transferred to floating diffusion node 45, the transfer signal 122 resets photodiode 52. Following the reset of photodiode 52 by transfer signal 122, photodiode 52 accumulates charge in response to incident light. The charge accumulated by photodiode 52 following the reset by transfer signal 122 may correspond to a second image having a relatively short integration time $t_{short}$. The second image may be useful in capturing images of relatively bright portions of a scene that may otherwise saturate pixels 28 using the long integration time provided by reset pointer signals 116 (e.g., the integration time that is proportional to the current value of M).

Between times $t_5$ and $t_6$, the second image may be read out from array 14. Reset signals (RESET(N)) may be taken high at time 126 thereby activating the reset transistors in row N and resetting the voltages on floating diffusion nodes 45 in row N. At time 128, reset control signals $V_{AA}$ may be deasserted (e.g., to turn off reset control transistors 66). When reset control transistors are turned off in this way and reset signals (RESET(N)) remain asserted, the capacitance of each of the floating diffusion nodes 45 in row N is supplemented by the capacitance of one of the reset lines 64 in sensor array 14.

Sample and hold signals (SHR) 130 may be asserted in circuitry 42 to sample and hold the reset voltages of nodes 45 in row N for the second image. Transfer signal TX(N) 132 activates the transfer transistors in row N, which transfers image charges accumulated by photodiodes 52 in response to incident light during the short integration time of the second image from photodiodes 52 to floating diffusion nodes 45 in row N and reset lines 64 (e.g., capacitors 68). Sample and hold signals (SHS) 134 may be asserted in circuitry 42 to sample and hold the accumulated charges for the second image in nodes 45 and reset lines 64 (e.g., the accumulated charges transferred from photodiodes 52). Circuitry 52 may then subtract the reset voltages from the accumulated charges (e.g., to reduce the noise levels in the accumulated charges). If desired, sample and hold circuitry 42 may sample reset voltages and accumulated charges on the falling edges of signals 130 and 134.

At time 135, reset control signals $V_{AA}$ may be asserted (e.g., to turn on reset control transistors 66).

Between times $t_4$ and $t_6$, row N+M of array 14 may be reset. Reset signals 136 and transfer signals 138 may be asserted to reset floating diffusion nodes 45 and photodiodes 52 in row N+M (e.g., while reset control signals $V_{AA}$ are asserted, before time 128 or after time 135).

Various embodiments have been described illustrating high dynamic range imaging systems.

An image sensor array may have pixels containing photosensitive elements such as photodiodes and containing storage devices such as floating diffusion nodes. The pixels may be arranged in the array in rows and columns. The array may include reset lines, each of which is coupled to the pixels in one of the columns of the array.

Reset control transistors may be provided in the array that selectively couple and decouple the reset lines to a reset power supply voltage node. When the reset control transistors are turned on and the reset lines are powered, the reset lines can be connected to the pixels in one or more rows of the array to discharge charges from the pixels (e.g., to reset the pixels).

The reset lines may have a parasitic capacitance. When the reset control transistors are turned off and the reset lines are not powered, the reset lines can be connected to the pixels in a row of the array to supplement the storage capacity (i.e., capacitance) of the storages devices in the pixels of that row. When the reset lines are used to supplement the storage capacity of the pixels in this way, the conversion gain of the pixels is reduced (relative to arrangements in which the reset lines are not used to supplement the storage capacity of the pixels).

The image sensor may be operated in a high dynamic imaging mode. In the high dynamic range imaging mode, a first image is captured and read out when the reset lines are used to supplement the storage capacity of the pixels, a second image is captured and read out while the reset lines are used to supplement the storage capacity of the pixels, and then the first and second images are used in forming a high dynamic range image.

The foregoing is merely illustrative of the principles of this invention which can be practiced in other embodiments.

What is claimed is:

1. A method of capturing an image with an imager having image sensing pixels arranged in rows and columns, wherein each of the image sensing pixels comprises a storage device having a capacitance, the method comprising:
   isolating reset lines from a reset voltage so that the reset lines have floating voltages, wherein each of the reset lines has a capacitance and is associated with a respective one of the columns of image sensing pixels; and
   while the reset lines are isolated from the reset voltage, supplementing the capacitances of the storage devices in a given row of image sensing pixels with the capacitances of the reset lines by coupling each of the reset lines to a respective one of the storage devices in the image sensing pixels in the given row.

2. The method defined in claim 1 wherein the imager comprises a plurality of reset control transistors each of which is coupled between a respective one of the reset lines and a power supply node at the reset voltage and wherein isolating the reset lines from the reset voltage comprises turning off the reset control transistors.

3. The method defined in claim 1 wherein each of the image sensing pixels comprises a reset transistor and wherein supplementing the capacitances of the storage devices in the given row comprises turning on the reset transistors in the image sensing pixels in the given row.

4. The method defined in claim 1 wherein the imager comprises a plurality of reset control transistors each of which is coupled between a respective one of the reset lines and a power supply node at the reset voltage, wherein each of the image sensing pixels comprises a reset transistor, wherein isolating the reset lines from the reset voltage comprises turning off the reset control transistors, and wherein supplementing the capacitances of the storage devices in the given row comprises turning on the reset transistors in the image sensing pixels in the given row.

5. The method defined in claim 1 wherein the imager comprises a plurality of reset control transistors each of which is coupled between a respective one of the reset lines and a power supply node at the reset voltage and wherein each of the image sensing pixels comprises a reset transistor, a photosensitive element, and a transfer transistor coupled between the photosensitive element in the image sensing pixel and the storage device in that image sensing pixel, the method further comprising:
   reading image data out of the image sensing pixels in the given row.

6. The method defined in claim 5 wherein each of the image sensing pixels comprises a row select transistor, wherein the row select transistors selectively couple the image sensing pixels to one of a plurality of column readout lines.

7. The method defined in claim 6 wherein reading the image data out of the image sensing pixels in the given row comprises turning on the row select transistors in the given row to couple each of the image sensing pixels in the given row to a respective one of the column readout lines and to image readout circuitry.

8. The method defined in claim 5 wherein reading the image data out of the image sensing pixels in the given row comprises:
   resetting the storage devices in the given row by simultaneously turning on the reset transistors in the given row and turning on the reset control transistors;

after resetting the storage devices in the given row, supplementing the capacitances of the storage devices in the given row with the capacitances of the reset lines by turning off the reset control transistors and by turning on the reset transistors in the given row;

with image readout circuitry and while the reset control transistors are turned off and the reset transistors in the given row are turned on, sampling a reset signal from the image sensing pixels in the given row;

while the reset control transistors are turned off and the reset transistors in the given row are turned on, transferring accumulated charges from the photosensitive elements in the image sensing pixels in the given row to the storage devices in the image sensing pixels in the given row by turning on the transfer transistors in the given row; and with the image readout circuitry and while the reset control transistors are turned off and the reset transistors in the given row are turned on, sampling an image signal from the image sensing pixels in the given row.

9. The method defined in claim 8 further comprising:

resetting the image sensing pixels in an additional given row by simultaneously turning on the transfer transistors in the additional given row, turning on the reset transistors in the additional given row, and turning on the reset control transistors.

10. A method of capturing high dynamic images with an imager having image sensing pixels arranged in rows and columns, wherein each of the image sensing pixels comprises a storage device having a capacitance, the method comprising:

with image readout circuitry, reading a first set of image data out of a given row of image sensing pixels;

isolating reset lines from a reset voltage so that the reset lines have floating voltages, wherein each of the reset lines has a capacitance and is associated with a respective one of the columns of image sensing pixels;

while the reset lines are isolated from the reset voltage, supplementing the capacitances of the storage devices in the given row of image sensing pixels with the capacitances of the reset lines by coupling each of the reset lines to a respective one of the storage devices in the image sensing pixels in the given row; and with image readout circuitry and while the reset lines are coupled to the storage devices in the given row, reading a second set of image data out of the given row of image sensing pixels.

11. The method defined in claim 10 wherein the image sensing pixels have a dynamic range equal to a ratio of a minimum luminance that causes the image sensing pixels to saturate to a minimum luminance at which the image sensing pixels produces an output with a signal-to-noise ratio above a threshold value, the method further comprising:

forming a high dynamic range image by combing image data from the first and second sets of image data, wherein the high dynamic range image has a dynamic range that is larger than the dynamic range of the image sensing pixels.

12. The method defined in claim 10 wherein the steps of isolating the reset lines from the reset voltage so that the reset lines have floating voltages, supplementing the capacitances of the storage devices in the given row of image sensing pixels with the capacitances of the reset lines, and reading the second set of image data out of the given row of image sensing pixels occur after the step of reading the first set of image data out of the given row.

13. The method defined in claim 10 wherein each of the image sensing pixels comprises a reset transistor and wherein reading the first set of image data out of the given row comprises turning off the reset transistors while the first set of image data is read out of the given row by the image readout circuitry.

14. The method defined in claim 13 wherein the imager comprises a plurality of reset control transistors each of which is coupled between a respective one of the reset lines and a power supply node at the reset voltage and wherein reading the second set of image data out of the given row comprises turning off the reset control transistors and turning on the reset transistors in the image sensing pixels in the given row.

15. An imager comprising:

an array of image sensing pixels arranged in columns and rows, wherein each of the image sensing pixels includes a storage device having a capacitance;

a plurality of reset lines, each of which is associated with a respective one of the columns of image sensing pixels, each of which is connected to each of the image sensing pixels in the respective one of the columns of image sensing pixels, and each of which has a capacitance; and a plurality of reset control transistors, each of which is associated with a respective one of the reset lines, each of which is coupled between the respective reset line and a power supply node, and each of which is turned off during at least a given time period so that the reset lines having a floating voltage.

16. The imager defined in claim 15 wherein each of the image sensing pixels comprises a reset transistor coupled between the storage device in that image sensing pixel and the reset line associated with that image sensing pixel and wherein, during the given period of time, the reset transistors in a given row are turned on so that the capacitances of the reset lines supplement the capacitances of the storage devices in the given row.

17. The imager defined in claim 16 wherein the storage devices comprise floating diffusion nodes.

18. The imager defined in claim 16 wherein the capacitances of the reset lines are provided by parasitic capacitances in the reset lines.

19. The imager defined in claim 16 wherein each of the reset lines comprises a capacitor connected between the reset line and a ground power supply voltage.

20. The imager defined in claim 16 wherein each of the image sensing pixels comprises:

a photosensitive device;

a transfer transistor coupled between the photosensitive device in that image sensing pixel and the storage device in that image sensing pixel;

an output transistor having a gate connected to the storage device in that image sensing pixel, having a first source-drain terminal coupled to a bias voltage, and having a second source-drain terminal; and a row select transistor having a gate that receives row select signals, having a first source-drain terminal coupled to the second source-drain terminal of the output transistor in that image sensing pixel, and having a second source-drain terminal coupled to a respective one of a plurality of column readout lines.

* * * * *